(12) United States Patent
Kamatani et al.

(10) Patent No.: US 6,812,497 B2
(45) Date of Patent: Nov. 2, 2004

(54) ORGANIC LIGHT EMITTING DEVICE

(75) Inventors: Jun Kamatani, Ohta-Ku (JP); Shinjiro Okada, Ohta-Ku (JP); Akira Tsuboyama, Ohta-Ku (JP); Takao Takiguchi, Ohta-Ku (JP); Seishi Miura, Ohta-Ku (JP); Takashi Moriyama, Ohta-Ku (JP); Satoshi Igawa, Ohta-Ku (JP); Manabu Furugori, Ohta-Ku (JP); Hironobu Iwawaki, Ohta-Ku (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/424,918

(22) Filed: Apr. 29, 2003

(65) Prior Publication Data

US 2003/0189216 A1 Oct. 9, 2003

Related U.S. Application Data

(63) Continuation of application No. PCT/JP03/02693, filed on Mar. 7, 2003.

(30) Foreign Application Priority Data

Mar. 8, 2002 (JP) ........................................ 2002/063703

(51) Int. Cl.$^7$ .......................... H01L 27/15; H01L 31/12; H01L 33/00
(52) U.S. Cl. .......................................... 257/79; 257/89
(58) Field of Search ............................... 257/79, 89, 80

(56) References Cited

U.S. PATENT DOCUMENTS

2001/0021464 A1 * 9/2001 Hwang et al. ............... 428/690
2002/0057051 A1 * 5/2002 Kobayashi ................... 313/504
2003/0197183 A1 * 10/2003 Grushin et al. ............... 257/79

FOREIGN PATENT DOCUMENTS

WO        WO 02/02714        1/2002

OTHER PUBLICATIONS

D.F. O'Brien, et al., "Improved Energy Transfer in Electro-phosphorescent Devices", Appl. Phys. Lett., vol. 74, No. 3, pp. 442–444 (1999).

M.A. Baldo, et al., "Very High–Efficiency Green Organic Light–Emitting Devices Based on Electrophosphorescence", Appl. Phys. Lett., vol. 75, No. 1, pp. 4–6 (1999).

P.S. Vincett, et al., "Electrical Conduction and Low Voltage Blue Electroluminescence in Vacuum–Deposited Organic Films", Thin Solid Films, vol. 94, No. 2, pp. 171–183 (1982).

C.H. Chen, et al., "Recent Developments in Molecular Organic Electroluminescent Materials", Macromol. Symp., vol. 125, pp. 1–48 (1997).

* cited by examiner

*Primary Examiner*—Phat X. Cao
(74) *Attorney, Agent, or Firm*—Fitzpatrick, Cella, Harper & Scinto

(57) ABSTRACT

An organic light emitting device having a high light emitting efficiency and a long light emission lifetime is provided that comprises a pair of electrodes provided on a substrate, and a light emitting layer comprising at least one layer of an organic substance provided between the electrodes, wherein the light emitting layer comprises a first organic substance and a second organic substance mainly concerning a light emission wavelength of the light emitting layer, and wherein the first organic substance comprises a fluorine-containing organic compound.

15 Claims, 4 Drawing Sheets

ORGANIC LIGHT EMITTING DEVICE

This application is a continuation of International Application No. PCT/JP03/02693 filed on Mar. 7, 2003, which claims the benefit of Japanese Patent Application No. 063703/2002, filed Mar. 8, 2002.

BACKGROUND OF THE INVENTION

1. Field of the Invention

The present invention relates to an organic thin film light emitting device used in a flat light source, a flat display or the like. More particularly, the present invention relates to a light emitting device using an organic compound, and more specifically to a device improved in durability by employing a fluorine-containing organic compound in a light emitting portion.

2. Related Background Art

Conventional examples of organic light emitting devices include a device that emits light when a voltage is applied to a vapor-deposited anthracene film (Thin Solid Films, 94 (1982) 171). In recent years, however, because of the advantages that formation of a large light emitting area can more easily be attained in the organic light emitting device than the inorganic light emitting device, desired colors can be obtained by the development of various new materials, and the devices can be driven at a low voltage, application studies on the organic light emitting device for forming devices, including material development, have been made actively.

For example, as is described in detail in Micromol. Symp. 125, 1–48 (1997), an organic electroluminescence (EL) device, which is a representative example of the organic light emitting device, has generally a structure in which upper and lower electrodes, and an organic layer including a light emitting layer formed between the electrodes are provided on a transparent substrate. The basic constitution thereof is shown in FIGS. 1A and 1B.

As shown in FIGS. 1A and 1B, an organic EL device is generally composed of a transparent electrode 14 and a metal electrode 11 on a transparent substrate 15, and a plurality of organic layers disposed between the electrodes. Like features in the respective figures are indicated with like numerals.

In FIG. 1A, an organic layer consists of a light emitting layer 12 and a hole transport layer 13. As the material for the transparent electrode 14, a material with a large work function, such as ITO, is used to achieve good hole-injecting characteristics from the transparent electrode 14 to the hole transport layer 13. As the material for the metal electrode 11, a material with a small work function, such as aluminum, magnesium and alloys thereof, is used to achieve good electron-injecting characteristics to the organic layer. These electrodes generally have a thickness of 50–200 nm.

For the light emitting layer 12, an aluminoquinolinol complex (a representative example is Alq3 shown in the following chemical formulas I) or the like is used. As the hole transport layer 13, for example, an electron-donating material such as a biphenyldiamine derivative (a representative example is α-NPD shown in the following chemical formulas I) is used.

The organic EL device constructed as described above has a rectifying property, and when an electric field is applied so as to make the metal electrode 11 act as a cathode and the transparent electrode 14 act as an anode, electrons are injected from the metal electrode 11 into the light emitting layer 12, and holes are injected from the transparent electrode 14 into the light emitting layer 12.

When the injected holes and electrons recombine in the light emitting layer 12, excitons are formed, and light is emitted in the process of the radiation and deactivation of these excitons. At this time, the hole transport layer 13 plays the role of an electron blocking layer to raise the recombination efficiency in the light emitting layer 12/hole transport layer 13 interface, and to enhance light emitting efficiency.

Furthermore, in FIG. 1B, an electron transport layer 16 is formed between the metal layer 11 and the light emitting layer 12 of FIG. 1A. Thus, by independently forming the electron transport layer 16 to isolate the light emitting function from the electron/hole transport function, and making more effective carrier blocking constitution, efficient light emitting can be performed. As the material for the electron transport layer 16, for example, an oxadiazole derivative or the like can be used.

Heretofore, in light emission generally used in the organic EL device, the excited state includes an excited singlet state and an excited triplet state. A light emission accompanying a transition from the former state to a ground state is referred to as fluorescence, while a light emission accompanying a transition from the latter state to a ground state is referred to as phosphorescence; and substances in these states are referred to as a singlet exciton and a triplet exciton, respectively.

Many of the organic light emitting devices so far studied utilize fluorescence generated in transition from the singlet exciton to a ground state. Recently, on the other hand, devices that utilize phosphorescence through triplet exciton have been studied.

The representative documents published concerning the results of such studies are: Document 1: D. F. O'brien et al., "Improved energy transfer in Electrophosphorescent device", Applied Physics Letters Vol. 74, No. 3, p. 422 (1999); and document 2: M. A. Baldo et al., "Very high-efficiency green organic light-emitting devices based on Electrophosphorescence", Applied Physics Letters Vol. 75, No. 1, p. 4 (1999).

In these documents, as shown in FIG. 1C, an organic layer of a four (4) layer structure is mainly used. In this structure, a hole transport layer 13, a light emitting layer 12, an exciton-diffusion preventing layer 17 and an electron transport layer 16 are stacked in the named order from the anode side. The materials used therein are carrier transport materials and phosphorescent materials shown in the following chemical formulas I. The term "phosphorescent material" used herein is intended to mean a material having phosphorescent properties at around 20° C.

The abbreviations of materials in the following chemical formulas I stand for the following means:

Alq3: aluminoquinolinol complex;
α-NPD: N4,N4'-di-naphthalen-1-yl-N4,N4'-diphenyl-biphenyl-4,4'-diamine;

CBP: 4,4'-N,N'-dicarbazole-biphenyl;
BCP: 2,9-dimethyl-4,7-diphenyl-1,10-phenanthroline;
Bphen: 4,7-diphenyl-1,10-phenanthroline;
PtOEP: platinum-octaethylporphyrine complex; and
Ir(ppy)3: Iridium-phenylpyridine complex.

[Chemical Formulas I]

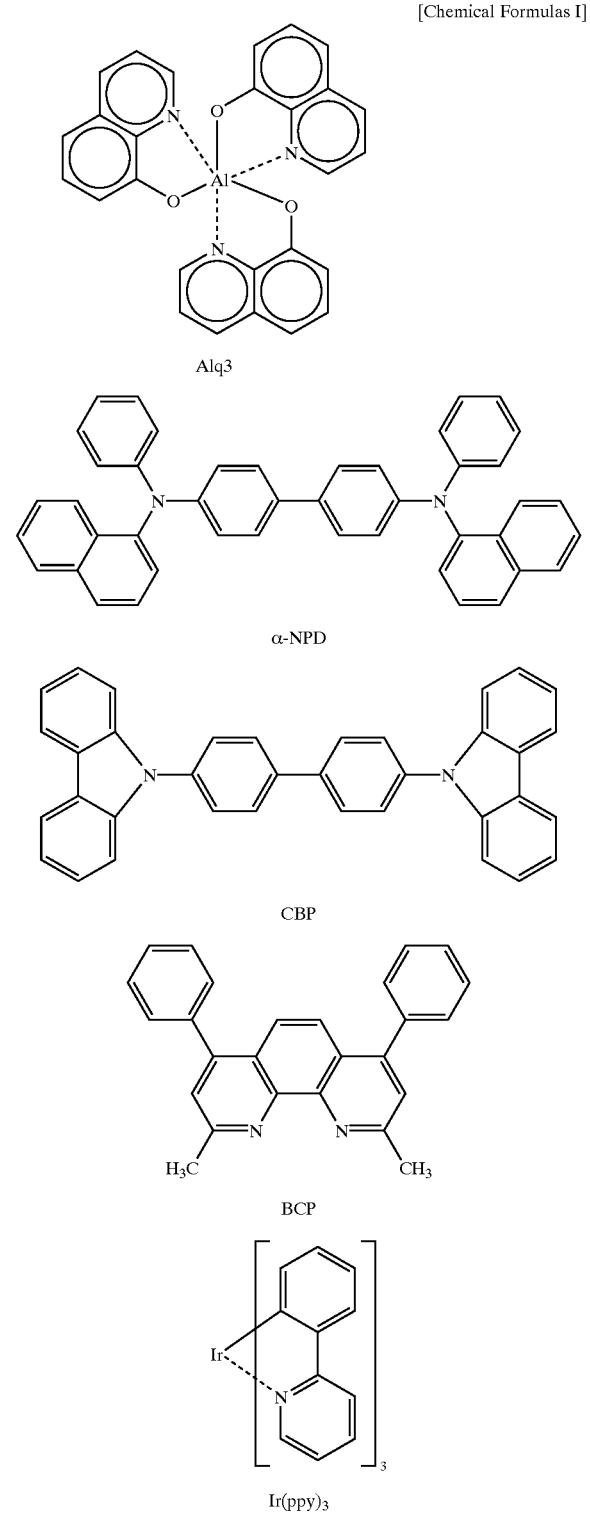

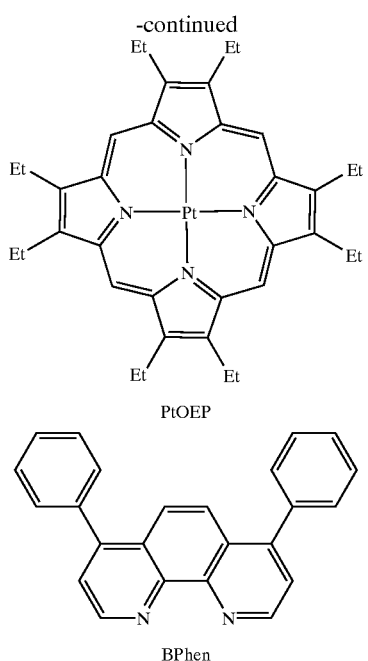

Devices that showed high light-emitting efficiencies in both Documents 1 and 2 were constituted by using α-NPD as the hole transport layer 13, Alq3 as the electron transport layer 16, and BCP as the exciton-diffusion preventing layer 17; and the light emitting layer 12 was constituted using CBP as the host material, and incorporating PtOEP or Ir(ppy) 3 as a phosphorescent material in a concentration of about 6% thereinto.

The reason why the phosphorescent material particularly attract attention is that a high light emitting efficiency can be theoretically expected. Specifically, excitons formed by the recombination of carriers consist of singlet excitons and triplet excitons, and the probability of the formation thereof is 1:3. Although conventional organic EL devices utilized fluorescence during the transition from the singlet exciton state to the ground state as light emission, the light emitting yield was theoretically 25% relative to the number of formed excitons, and this was the theoretical upper limit. However, if phosphorescence from excitons generated from the triplet state is used, at least 3-fold yield is theoretically expected, and when the transfer by the intersystem crossing from the singlet state of a high energy level is considered, 4-fold, that is 100%, light emitting efficiency can be theoretically expected.

International Publication No. WO 02/02714 discloses an example of a device using a fluorine-containing compound in a light emitting layer, and reports that use of a fluorinated material only as a guest material, which is a material that contributes to light emission, inhibited lowering of the light emitting efficiency even if the content of the guest material was elevated, compared with the case wherein a non-fluorinated material was used.

The light emission lifetime of an organic light emitting device is affected by factors, such as the glass transition temperature and the stability to electric charge of the material for the charge transport layer and the light emitting material, and the interfacial state between layers; and furthermore, in the host-guest light emitting layer wherein two or more components of conductive host materials and light emitting guest materials are mixed, by various factors, such as the dispersibility and the content of each organic material, stability during vapor deposition, and moisture content.

Thus, there are generally a large number of factors affecting the lifetime of an organic light emitting device. Therefore, there is a continuing need for a device constitution that enables the elongation of the lifetime of organic light emitting devices.

SUMMARY OF THE INVENTION

It is, therefore, an object of the present invention to provide an organic light emitting device that has a high light emitting efficiency and a long light emission lifetime.

According to the present invention, there is provided an organic light emitting device comprising a pair of electrodes provided on a substrate, and a light emitting layer comprising at least one layer of an organic substance provided between the electrodes, wherein the light emitting layer comprises a first organic substance and a second organic substance mainly concerning a light emission wavelength of the light emitting layer, and wherein the first organic substance comprises a fluorine-containing organic compound.

DESCRIPTION OF THE PREFERRED EMBODIMENTS

Figure 1A:
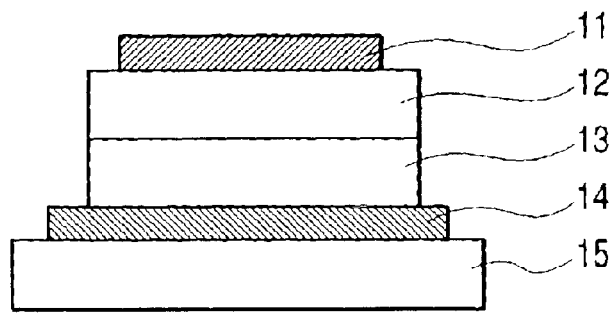
FIGS. 1A, 1B and 1C are schematic vies each showing an example of the constitution of an organic light emitting device of the present invention.

The term "fluorine-containing organic compounds" used herein is intended to mean an organic compound that contains at least one fluorine atom in one molecule thereof, or when it is a polymer compound, an organic polymer compound that contains at least one fluorine atom in one repeating unit (monomer unit) thereof, and is hereinafter sometimes abbreviated as "fluorine-containing compound" as needed.

In the present invention, it is preferred that the chemical structure of the first organic compound is characterized by containing a single fluorine atom in one molecule of the organic substance, or having fluorine atoms in one molecule thereof.

Further, it is preferred that the second organic substance comprises a phosphorescent organic compound.

Moreover, it is preferred that the content of fluorine in the first organic substance is 1% by weight or more.

In addition, it is preferred that both the first organic substance and the second organic substance contain fluorine, or that each of the first organic substance and the second organic substance is composed of plural kinds of organic substances and each molecule of all the organic compounds contains at least one fluorine atom.

In order to prolong the lifetime of an organic EL device, it is needless to say that the stability of an organic compound itself that composes the device is important. However, there are also problems of how to transfer an energy between hosts or between a host and a guest efficiently, or how to prevent mixing by mutual diffusion between a light emitting layer and a charge transfer layer to inhibit transfer of an excitation energy to a charge transfer layer. Further, as the organic compound to be used, it can be said that a compound having good vapor-deposition properties and high hydrophobicity is ideal. Between a host and a guest, it can be considered that good matching of the host with the guest, for example, better dispersibility, is preferable to inhibit degradation with the elapse of time from initial characteristics.

For these reasons, the present inventors have found that the prolonged life could be realized by the use of a fluorine-containing compound for the light emitting portion.

According to such a constitution of the present invention, by the use of a fluorine-containing compound in the light emitting layer, the stability of the device is improved. This is considered for the following reasons.

Namely, when fluorine atoms are incorporated in a molecule of a compound, the sublimation temperature of the compound lowers and sublimation becomes easier, shortening the vapor deposition time, or enabling stable vapor deposition, and decomposition during vapor deposition is inhibited. Since a fluorine atom has lower affinity to water than a hydrogen atom, incorporation of water is inhibited, and when compared with equivalent compounds that do not contain fluorine atoms, incorporation of water during storage or vapor deposition can be inhibited.

Moreover, it is considered as a further effect that since a fluorine-containing compound is difficult to mix not only with water, but also with ordinary compounds that do not contain halogen atoms, mixing of layers due to mutual diffusion between a transport layer and a blocking layer in a light emission interface is difficult to occur, and the deactivation of an energy due to layer mixing in a light emitting portion can be inhibited.

Furthermore, it is considered that when a fluorine-containing compound is used as a guest in a layer of a host-guest structure, if a fluorine-containing compound is used also as the host, the dispersibility of the guest is improved, and degradation due to aggregation is inhibited, compared with a case wherein a compound that does not contain fluorine is used as the host.

In fact, the present inventors have found that when a fluorine-containing compound is used as a guest in a layer of a host-guest structure, further when a fluorine-containing compound is used also as the host, the degradation with the elapse of time is retarded, compared with a case where a compound that does not contain fluorine is used as the host.

Although the above-described constitution of the present invention is characterized by allowing a molecule of a compound to contain fluorine, since a change in an energy gap of the compound occurs by incorporating fluorine atoms in the molecule, that is, since an absolute value of HOMO/LUMO increases to improve the electron affinity, the above-described fluorine-containing compounds can be considered to be a material with improved electron transportation characteristics, and can be utilized not only in a light emitting layer, but also in other transport layers and the like.

For the reasons described above, according to the constitution of the present invention, a light emitting material suited for prolongation of the lifetime of a light emitting device.

Also in the present invention, for the purpose of preventing the mixing of the layers due to the mutual diffusion as described above, a fluorine-containing compound can further be used as the material of a layer adjacent to the light emitting layer.

Furthermore, when the constitution as a device is considered, the use of a fluorine-containing compound in any one of the other layers in addition to the light emitting layer can effectively inhibit incorporation of water, and use of a fluorine-containing compound in all the layers can prolong the lifetime.

The incorporation of fluorine in the layers can be realized by using a fluorine-containing compound in some or all of the organic substances used for the fabrication of the layers.

The following general formulas (1) are examples of fluorine-containing organic compounds included by the first organic substance of the present invention.

General Formulas (1)

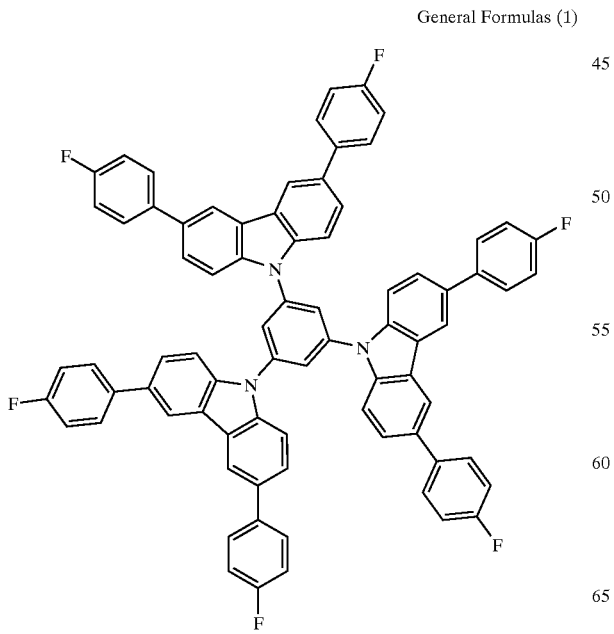

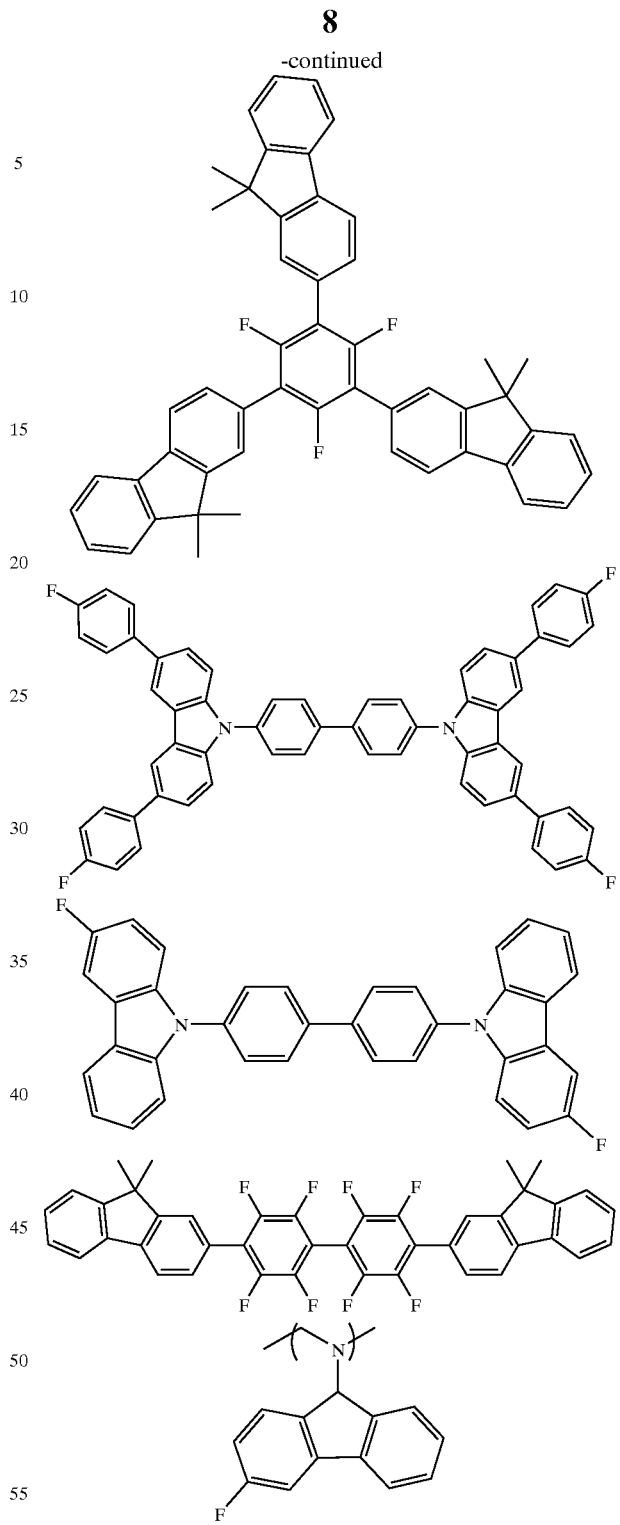

As the second organic substance that mainly concerns the light emission wavelength of the light emitting layer, there are included fluorescent materials, phosphorescent materials and the like that emit light when an electric charge is imparted. In the case of phosphorescent materials, it is preferable to use a metal complex having atoms of copper (Cu), rhenium (Re), ruthenium (Ru), rhodium (Rh), thulium (Tm), iridium (Ir), platinum (Pt), gold (Au), etc. as the metal center or the like, but the present invention is not limited to these metals.

The following general formulas (2) are examples of compounds that can be used as the second organic substance.

General Formulas (2)
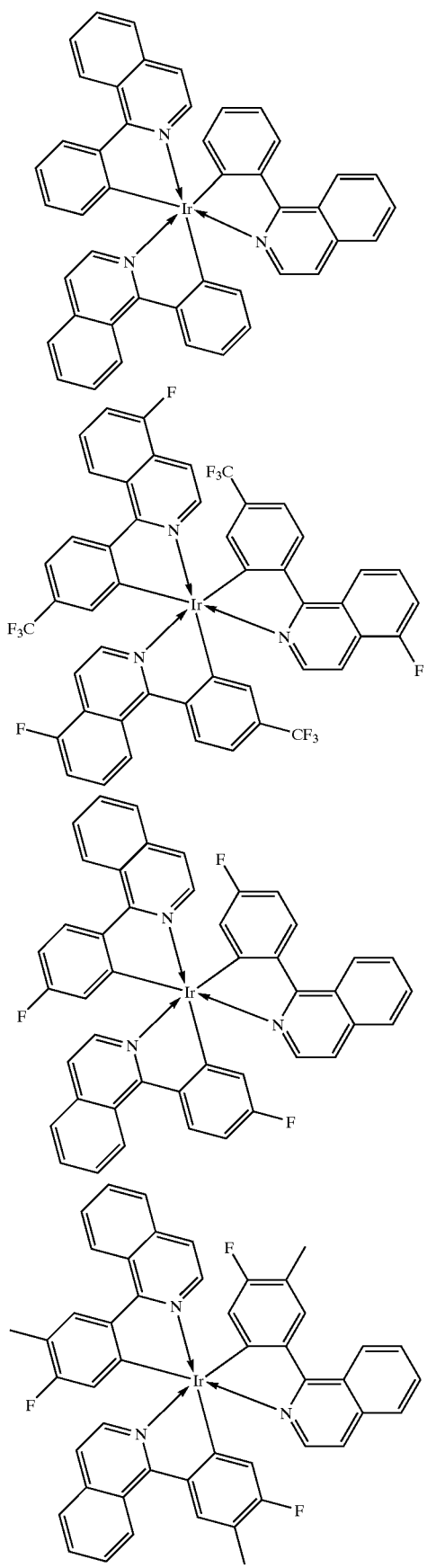
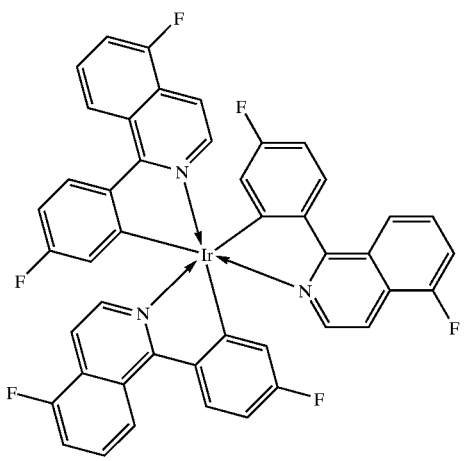
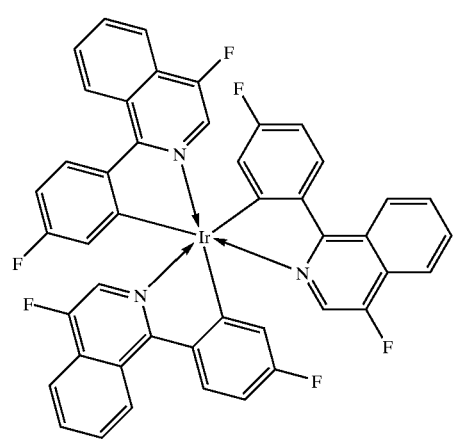
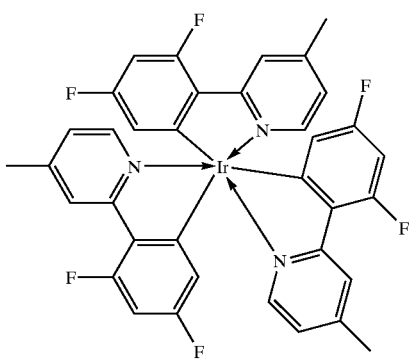
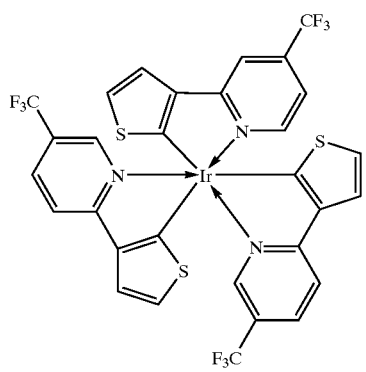

-continued

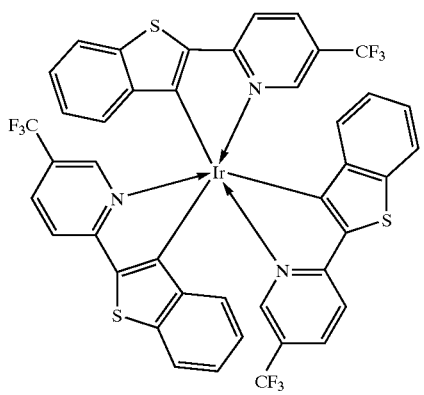

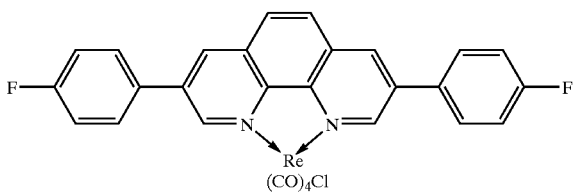

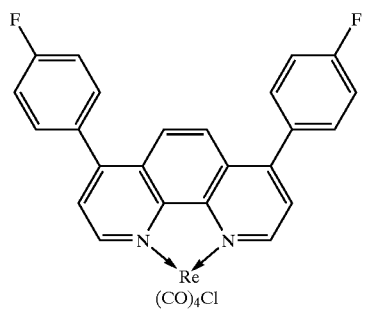

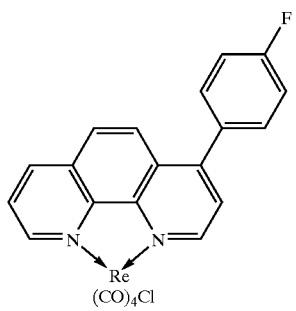

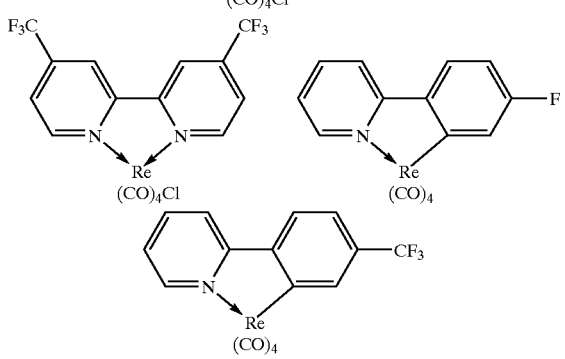

Figure 1B:
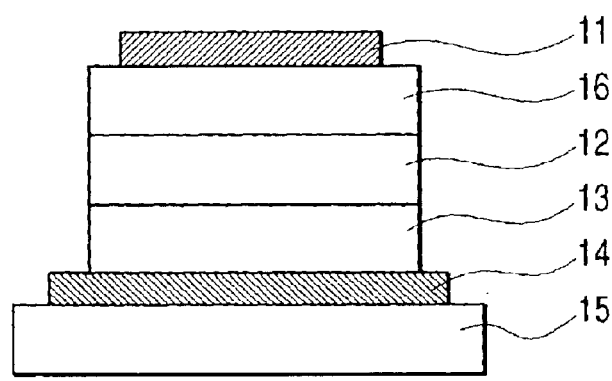
Figure 1C:
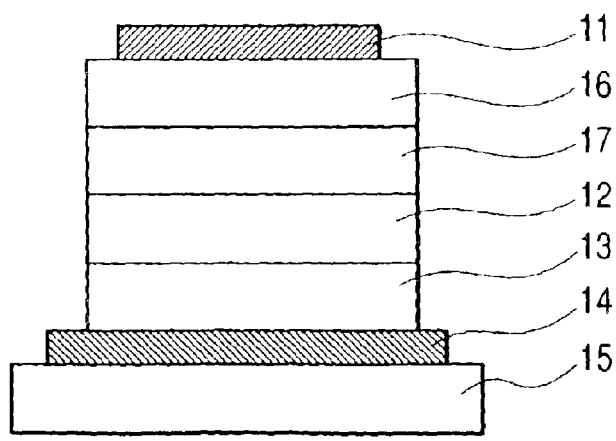

It is preferable that the organic light emitting device of the present invention is an electroluminescent device (EL device) of a structure as shown in FIGS. 1A to 1C, wherein a fluorine-containing organic compound layer is sandwiched by two opposing electrodes, and light is emitted by applying a voltage between the electrodes.

EXAMPLES

The present invention will be specifically described below referring to examples.

Example 1

In this example, a device of a device constitution having three organic layers was fabricated. After forming an ITO film (transparent electrode 14) of a thickness of 100 nm on a glass substrate (transparent substrate 15), the film was patterned in stripes in accordance in the usual way. The following organic layers and electrode layers of the following thicknesses were formed using the following material substances on the ITO film by vacuum vapor deposition using the resistance heating method in a vacuum chamber of $10^{-4}$ Pa.

Organic layer 1 (hole transport layer 13): film thickness 40 nm: material substance HT-A;

Organic layer 2 (light emitting layer 12): film thickness 20 nm: material substance EH-A (92% by weight)/EG-A (8% by weight);

Organic layer 3 (electron transport layer 16): film thickness 50 nm: material substance Bphen;

Metal electrode layer 1: film thickness 1 nm: material substance KF; and

Metal electrode layer 2: film thickness 100 nm: material substance Al

The metal electrode layers 1 and 2 were formed so as to be perpendicular to the ITO electrodes, and equally patterned in stripes so that the opposing area of the electrodes becomes 3 mm².

The chemical structures of the substances used in forming each organic layer are shown in the following chemical formulas II.

[General Formulas II]

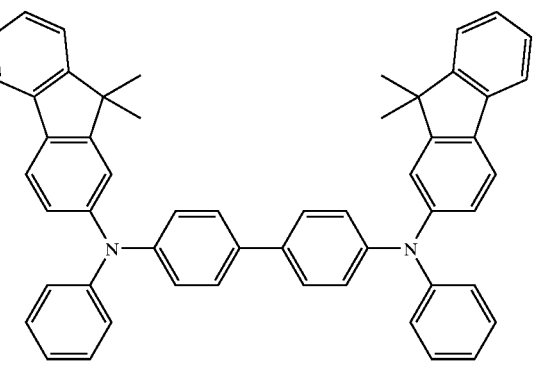

HT-A

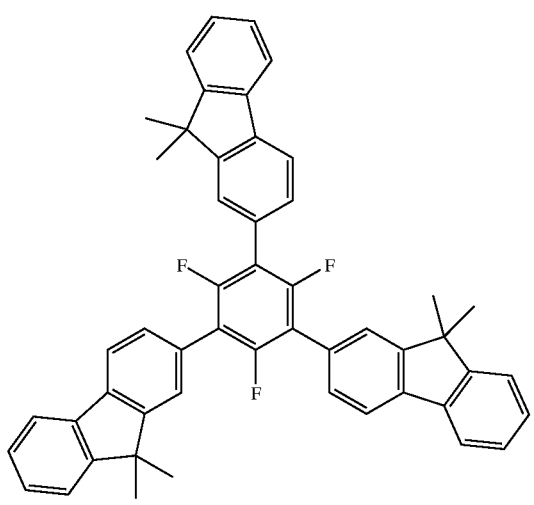

EH-A

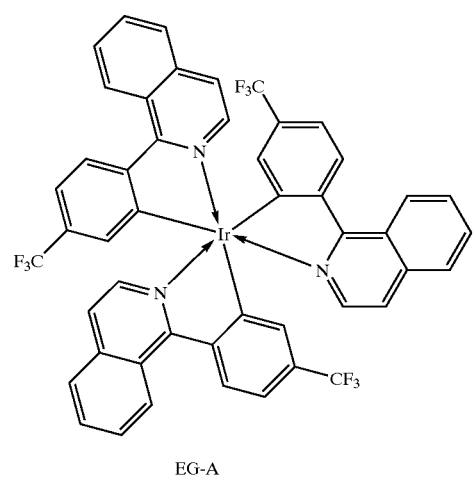

EG-A

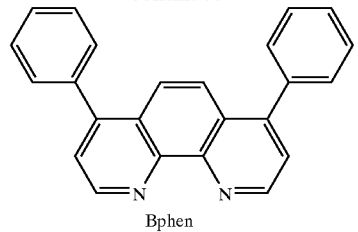

Bphen

Comparative Example 1

A device was fabricated following the same procedure as in Example 1, with the exception that EH-B of the following structure was used in place of EH-A used for the organic layer 2 in Example 1.

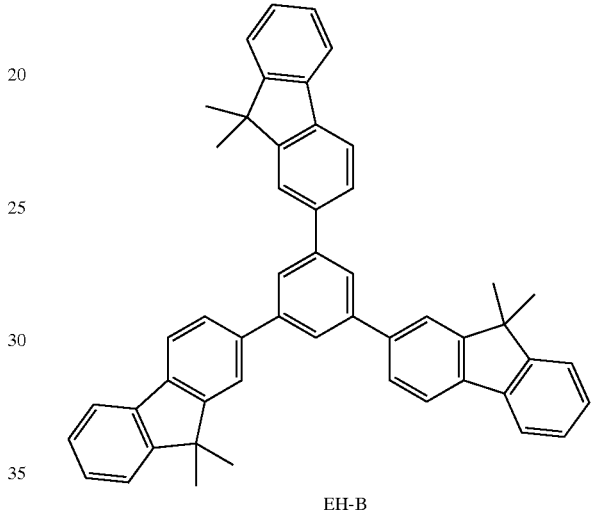

EH-B

Example 2

A device was fabricated following the same procedure as in Example 1, with the exception that EH-C of the following structure was used in place of EH-A used for the organic layer 2 in Example 1.

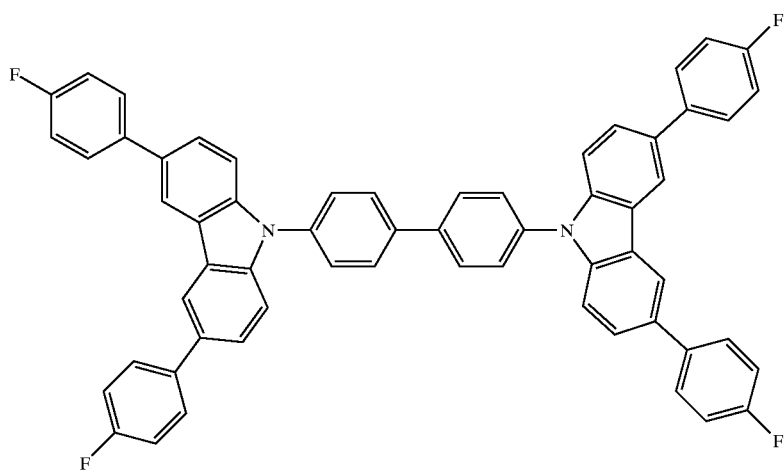

EH-C

Example 3

A device was fabricated following the same procedure as in Example 1, with the exception that EH-D of the following structure was used in place of EH-A used for the organic layer 2 in Example 1.

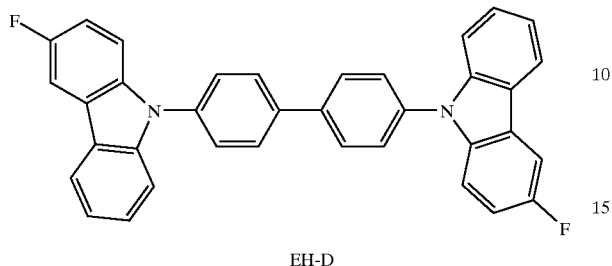

EH-D

Comparative Example 2

A device was fabricated following the same procedure as in Example 1, with the exception that CBP described above was used in place of EH-A used for the organic layer 2 in Example 1.

Example 4

A device was fabricated following the same procedure as in Example 1, with the exception that EH-E of the following structure was used in place of EH-A used for the organic layer 2 in Example 1.

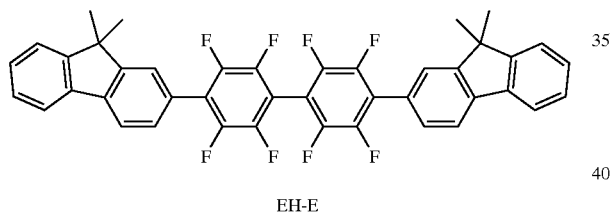

EH-E

Comparative Example 3

A device was fabricated following the same procedure as in Example 1, with the exception that EH-F of the following structure was used in place of EH-A used for the organic layer 2 in Example 1.

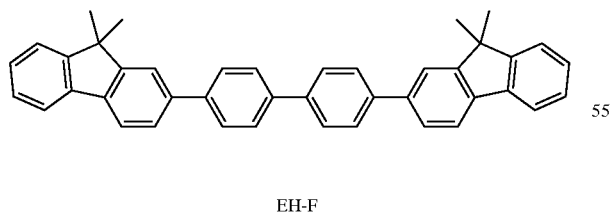

EH-F

Example 5

A device was fabricated following the same procedure as in Example 1, with the exception that EG-B of the following structure was used in place of EG-A, and EH-E was used in place of EH-A used for the organic layer 2 in Example 1.

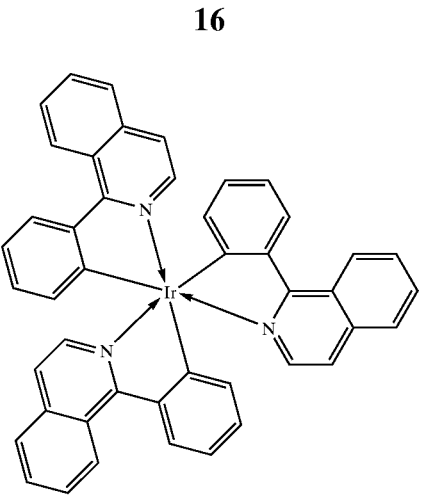

EG-B

Example 6

A device was fabricated following the same procedure as in Example 1, with the exception that EG-C of the following structure was used in place of EG-A used for the organic layer 2 in Example 1.

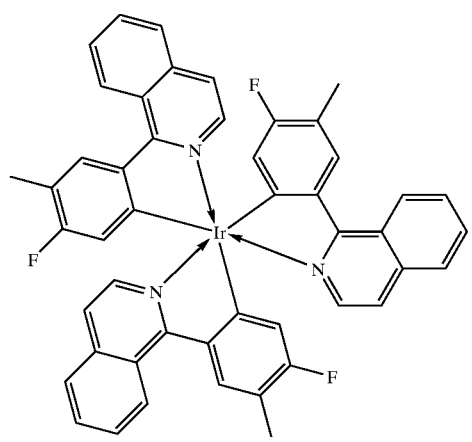

EG-C

Example 7

A device was fabricated following the same procedure as in Example 1, with the exception that EG-D of the following structure was used in place of EG-A used for the organic layer 2 in Example 1.

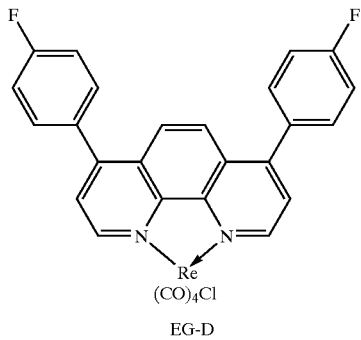

EG-D

An electric field was applied to each of the devices fabricated in Examples 1 to 7 and Comparative Examples 1 to 3 so that the ITO (transparent electrode 14) became an anode, and Al (metal electrode 11) became a cathode, and the light emission lifetime of each device was measured. Specifically, the luminance was set to about 1,000 cd/cm$^2$, and the half-value period of luminance was measured under a constant current. Since the presence of oxygen or water poses a problem as a cause of the degradation of a device, in order to remove the cause, the above measurement was performed in a dry nitrogen flow after the device was taken out of the vacuum chamber.

The results obtained for each device are shown in Table 1.

TABLE 1

|  | Half-value period of luminance (h) |
| --- | --- |
| Example 1 | 15 |
| Comparative Example 1 | 0.2 |
| Example 2 | 10 |
| Example 3 | 40 |
| Comparative Example 2 | 0.1 |
| Example 4 | 14 |
| Comparative Example 3 | 0.5 |
| Example 5 | 17 |
| Example 6 | 15 |
| Example 7 | 4 |

It was confirmed from the results shown in Table 1 that in the case of using a fluorine-containing guest, when a host not containing fluorine was used, the half-value period of luminance was very short; however, when a fluorine-containing host was used, the half-value period of luminance elongated several to several hundred times. Further, when a combination of a fluorine-containing host and a guest not containing fluorine was used, substantially the same effect as in a fluorine-containing host/fluorine-containing guest combination.

Example 8

A device was fabricated following the same procedure as in Example 1, with the exception that a combination of EH-D and CBP wherein the fluorine content in the total quantity thereof was adjusted to be 1% by weight was used in place of EH-A used for the organic layer 2 in Example 1 to perform the vapor deposition.

Example 9

A device was fabricated following the same procedure as in Example 1, with the exception that a combination of EH-D and CBP wherein the fluorine content in the total quantity thereof was adjusted to be 10% by weight was used in place of EH-A used for the organic layer 2 in Example 1 to perform the vapor deposition.

Comparative Example 4

A device was fabricated following the same procedure as in Example 1, with the exception that a combination of EH-D and CBP wherein the fluorine content in the total quantity thereof was adjusted to be 0.1% by weight was used in place of EH-A used for the organic layer 2 in Example 1 to perform the vapor deposition.

An electric field was applied to each of the devices fabricated in Examples 8 and 9 and Comparative Example 4 so that the ITO (transparent electrode 14) became an anode and Al (metal electrode 11) became a cathode, and the light emission lifetime was measured. Specifically, the luminance was set to about 1,000 cd/cm$^2$, and the half-value period of luminance was measured under a constant current. Since the presence of oxygen or water poses a problem as the cause of the degradation of a device, in order to remove the cause, the above measurement was performed in a dry nitrogen flow after the device was taken out of the vacuum chamber.

The results obtained for each device are shown in Table 2.

TABLE 2

|  | Half-value period of luminance (h) |
| --- | --- |
| Example 8 | 5 |
| Example 9 | 15 |
| Comparative Example 4 | 0.5 |

Example 10

A device was fabricated following the same procedure as in Example 1, with the exception that a combination of EG-A and EG-B wherein the fluorine content in the total quantity thereof was adjusted to be 1% by weight was used in place of EG-A used for the organic layer 2 in Example 1 to perform the vapor deposition; and furthermore, a combination of EH-D and CBP wherein the fluorine content in the total quantity thereof was adjusted to be 1% by weight was used in place of EH-A to perform the vapor deposition.

Comparative Example 5

A device was fabricated following the same procedure as in Example 1, with the exception that a combination of EG-A and EG-B wherein the fluorine content in the total quantity thereof was adjusted to be 1% by weight was used in place of EG-A used for the organic layer 2 in Example 1 to perform the vapor deposition; and furthermore, a combination of EH-D and CBP wherein the fluorine content in the total quantity thereof was adjusted to be 0.1% by weight was used in place of EH-A to perform the vapor deposition.

An electric field was applied to each of the devices fabricated in Example 10 and Comparative Example 5 so that the ITO (transparent electrode 14) became an anode and Al (metal electrode 11) became a cathode, and the light emission lifetime was measured. Specifically, the luminance was set to about 1,000 cd/cm$^2$, and the half-value period of luminance was measured under a constant current. Since the presence of oxygen or water poses a problem as the cause of the degradation of a device, in order to remove the cause, the above measurement was performed in a dry nitrogen flow after the device was taken out of the vacuum chamber.

The results obtained for each device are shown in Table 3.

TABLE 3

|  | Half-value period of luminance (h) |
| --- | --- |
| Example 10 | 8 |
| Comparative Example 5 | 0.3 |

Example 11

In this example, a device of a device constitution having two organic layers shown in FIG. 1A was fabricated. As in Example 1, after forming an ITO film (transparent electrode 14) of a thickness of 100 nm on a glass substrate (transparent substrate 15), the film was patterned in stripes in the usual way. The following organic layers and electrode layers of the following thickness were sequentially formed using the following material substances on the ITO film by vacuum vapor deposition using the resistance heating method in a vacuum chamber of $10^{-4}$ Pa.

Organic layer 1 (hole transport layer 13): film thickness 50 nm: material substance EH-C;

Organic layer 2 (light emitting layer 12): film thickness 50 nm: material substance EH-E (92% by weight)/EG-A (8% by weight);

Metal electrode layer 1: film thickness 1 nm: material substance KF; and

Metal electrode layer 2: film thickness 100 nm: material substance Al

The metal electrode layers 1 and 2 were formed so as to be perpendicular to the ITO electrodes, and equally patterned in stripes so that each opposing area of the electrodes becomes 3 mm².

When an electric field was applied to the fabricated device with the ITO side used as the anode and the Al side used as the cathode, the emission of red light derived from EG-A was confirmed.

Example 12

Through the synthesis route shown below, PEH-A (Mn= 150,000; Mw/Mn=2.3 (in THF, in terms of polystyrene standard)) was synthesized.

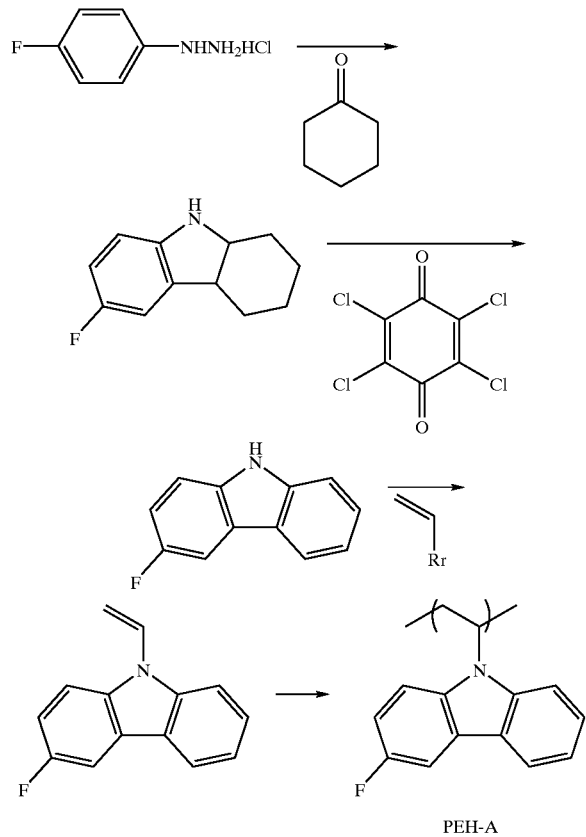

PEH-A

An organic EL device having three organic layers of the constitution shown in FIG. 1B was fabricated, and the device characteristics were measured. An alkali-free glass substrate was used as the transparent electrode 15, an indium oxide (ITO) film of a thickness of 100 nm was formed thereon as the transparent electrode 14 using the sputtering method, and the ITO film was subjected to patterning.

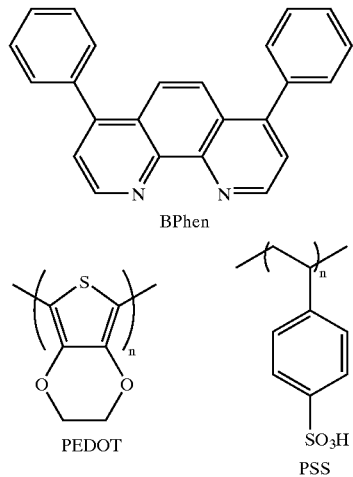

A high-polymer film consisting of PEDOT and PSS shown in the above structural formulas of a film thickness of 30 nm was formed thereon as the hole transport layer 13 by the spin-coating method. A 1.0% chloroform solution of powder formed by mixing PEH-A and EG-A in the weight ratio of 10:1 was spin-coated plural times thereon as the light emitting layer 12, and dried for 60 minutes in an oven at 60° C. to obtain the light emitting layer 12 of a film thickness of 30 nm. Furthermore, as the electron transport layer 16, Bphen having the above structure was resistance-heated under a vacuum of $10^{-4}$ Pa to vapor-deposit an organic film of a film thickness of 40 nm.

Thereon, potassium fluoride KF was disposed as an underlying layer of the metal electrode 11. Furthermore, as the metal electrode 11, an aluminum (Al) film of a film thickness of 100 nm was vapor-deposited thereon, and patterned in a form so that the area of the electrode opposing the transparent electrode 14 becomes 3 mm².

As the characteristics of the fabricated EL device, the current-voltage characteristics were measured using Hewlett Packard 4140B Pico-amp meter, and light-emission luminance was measured using Topcon BM7 luminance colorimeter. As a result, the device fabricated using the compounds of this example exhibited good rectification properties.

When a voltage of 15 V was applied, light emission from the EL device of this example was confirmed. In this example, emission of red light appearing to be derived from EG-A was confirmed.

Example 13

A device was fabricated following the same procedure as in Example 12, with the exception that EG-B was used in place of EG-A used for the organic layer in Example 12.

Comparative Example 6

A device was fabricated following the same procedure as in Example 12, with the exception that PVK of the following structure was used in place of PEH-A used for the organic layer in Example 12.

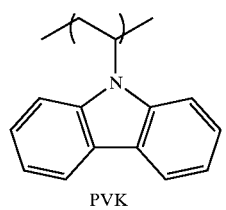

PVK

An electric field was applied to each of the devices fabricated in Examples 12 and 13 and Comparative Example 6 so that the ITO (transparent electrode 14) became an anode and Al (metal electrode 11) became a cathode, and the light emission lifetime was measured. Specifically, the luminance was set to about 1,000 cd/cm$^2$, and the half-value period of luminance was measured under a constant current. Since the presence of oxygen or water poses a problem as the cause of the degradation of a device, in order to remove the cause, the above measurement was performed in a dry nitrogen flow after the device was taken out of the vacuum chamber.

The results obtained for each device are shown in Table 4.

TABLE 4

|  | Half-value period of luminance (h) |
|---|---|
| Example 12 | 18 |
| Example 13 | 15 |
| Comparative Example 6 | 2 |

Example 14

In this example, two examples of image display apparatuses will be described.

Figure 2:
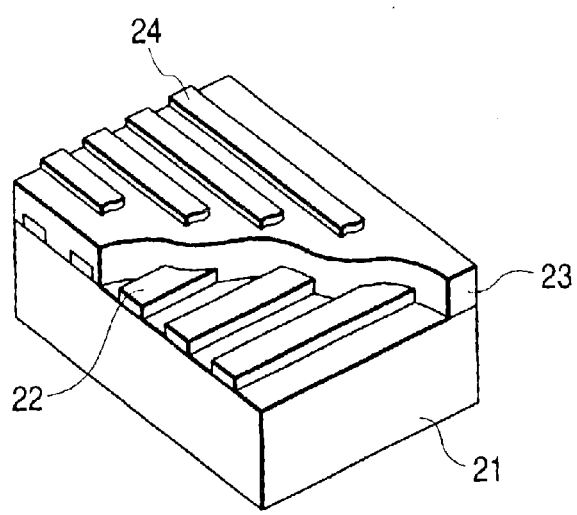
FIG. 2 is a partly broken perspective view showing the constitution of the simple matrix type organic EL device of Example 14.

First, an example of fabrication of an image display apparatus having an XY matrix such as shown in FIG. 2 will be described.

After forming an ITO film of a thickness of about 100 nm as a transparent electrode 22 (anode side) by the sputtering method on a glass substrate 21 of a length of 150 mm, a width 150 mm and a thickness of 1.1 mm, 100 lines were patterned at a distance of line/space=100 μm/40 μm as simple matrix electrodes. Next, under the same conditions as in Example 1, the same organic compound layers 23 as those fabricated in Examples 1 to 7 were formed, respectively.

Then, metal electrodes 24 (cathode side) for 100 lines of line/space=100 μm/40 μm were formed so as to be perpendicular to the transparent electrodes by the vacuum vapor deposition method under the vacuum condition of 2×10$^{-5}$ Torr. As the metal electrodes, an Al/Li alloy (Li: 1.3% by weight) of a film thickness of 10 nm, and then, Al of a film thickness of 150 nm were formed.

Figure 3:
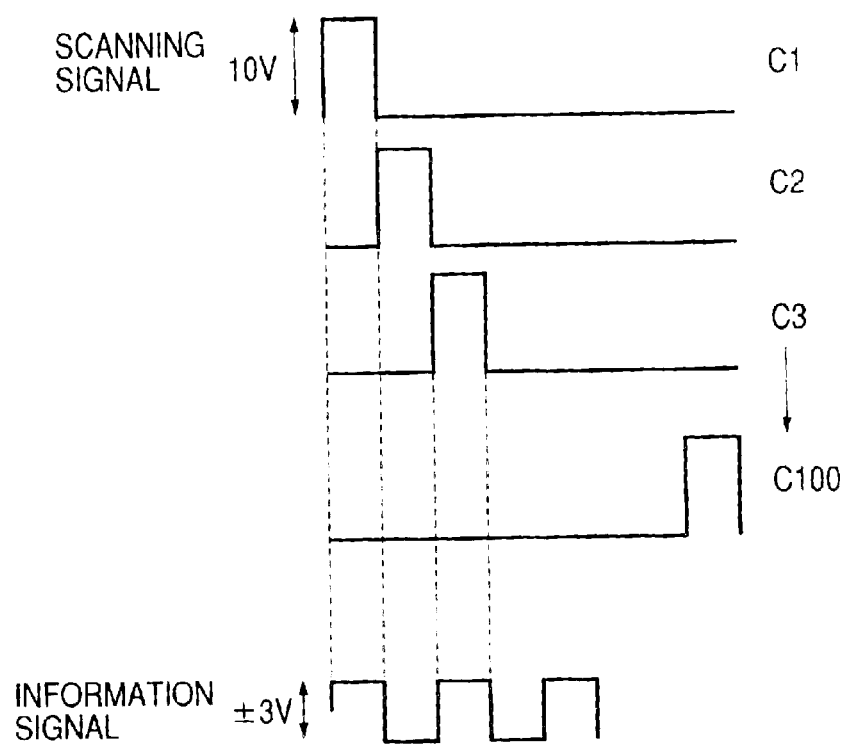
FIG. 3 is a diagram showing drive signals of the simple matrix type organic EL device of Example 14.

This 50×50 simple-matrix-type organic EL device was placed in a glove box filled with a nitrogen atmosphere, and simple matrix-driven using a scanning signal of 10 V and an information signal of ±3 V shown in FIG. 3 at a voltage from 7 V to 13 V. By interlace driving at a frame frequency of 30 Hz, light emitting images were confirmed in the respective devices.

According to the light emitting device of a high light emitting efficiency of the present invention, as an image display apparatus, a lightweight flat-panel display with energy saving performance and high visibility can be provided. As a light source for printers, utilization as a line shutter can be attained by forming the light emitting devices of the present invention in a line, disposing the devices in the vicinity of a photosensitive drum, and driving each device independently to perform a desired exposure to the photosensitive drum. On the other hand, when it is utilized as a backlight of illumination apparatuses or liquid crystal displays, energy-saving effect can be expected.

As another example of the image display apparatus, an active matrix image display apparatus equipped with thin film transistors (TFTs) in place of the above-described XY matrix wiring is particularly useful. An active matrix image display apparatus to which the present invention is applied will be described below referring to FIGS. 4 to 6.

Figure 4:
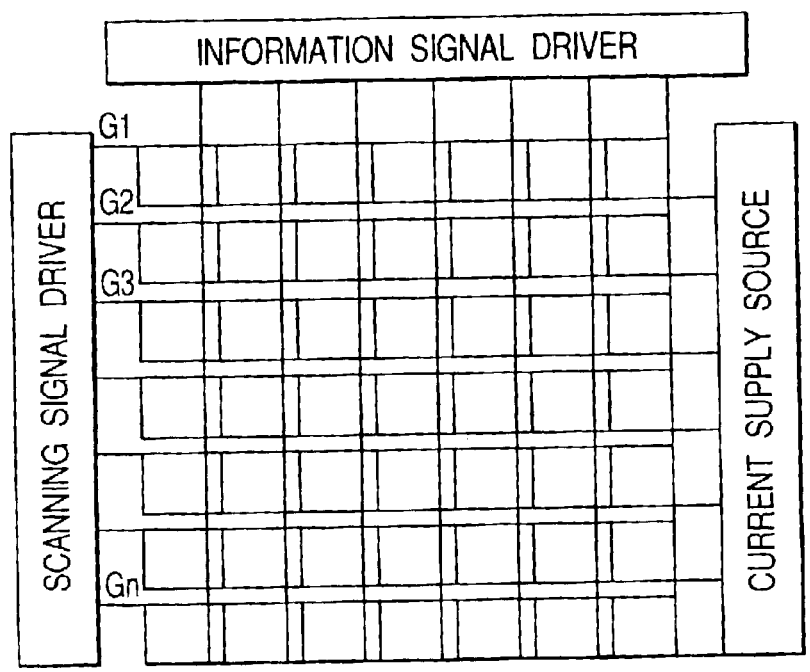
FIG. 4 is a schematic diagram showing an example of a panel constitution equipped with an organic EL device and a drive means.

FIG. 4 is a schematic plan view of the above-described device panel. Around the panel are disposed a drive circuit consisting of a scanning signal driver and a current supply source, and a display-signal input means, which is an information signal driver (these are referred to as "image information supply means"), each of which is connected to X-direction scanning lines called gate lines, Y-direction wirings called information lines, and current supply lines. The scanning signal driver selects the gate scanning lines sequentially, and image signals are supplied from the information signal driver synchronizing therewith. Pixels for display are disposed on the intersections of the gate scanning lines and information lines.

Figure 5:
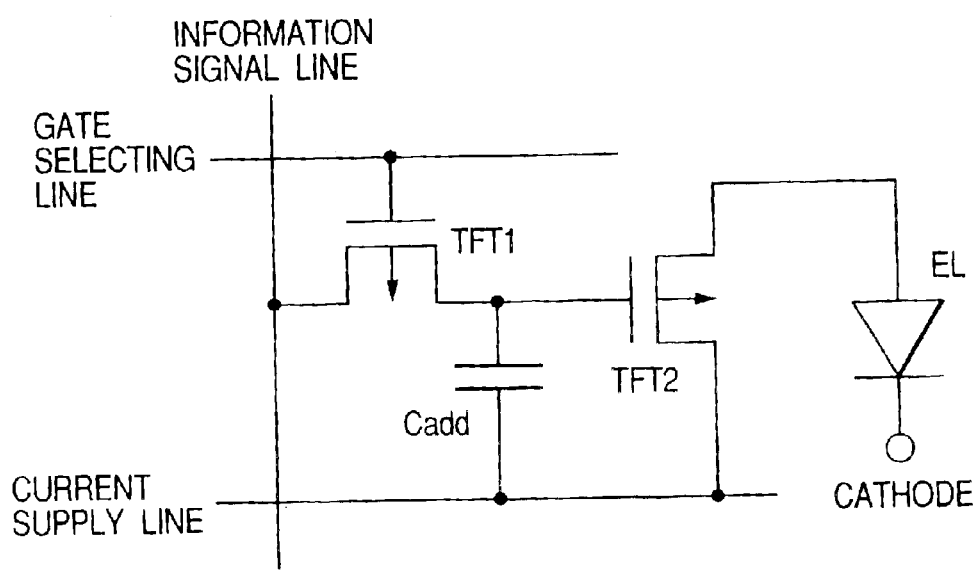
FIG. 5 is a diagram showing an example of a pixel circuit.

Next, the operation of the pixel circuit will be described using the equivalent circuit shown in FIG. 5. Now, when a selection signal is applied to the gate selecting line, TFT1 is turned on and a display signal is supplied from the information signal line to a capacitor Cadd to determine the gate potential of TFT2. To the organic EL device portion disposed in each pixel is supplied a current from the current supply line depending on the gate potential of TFT2. Since the gate potential of TFT2 is retained in Cadd during one frame period, the current from the current supply line continues to flow in the EL device portion during this period. Thereby, light emission can be maintained during one frame period.

Figure 6:
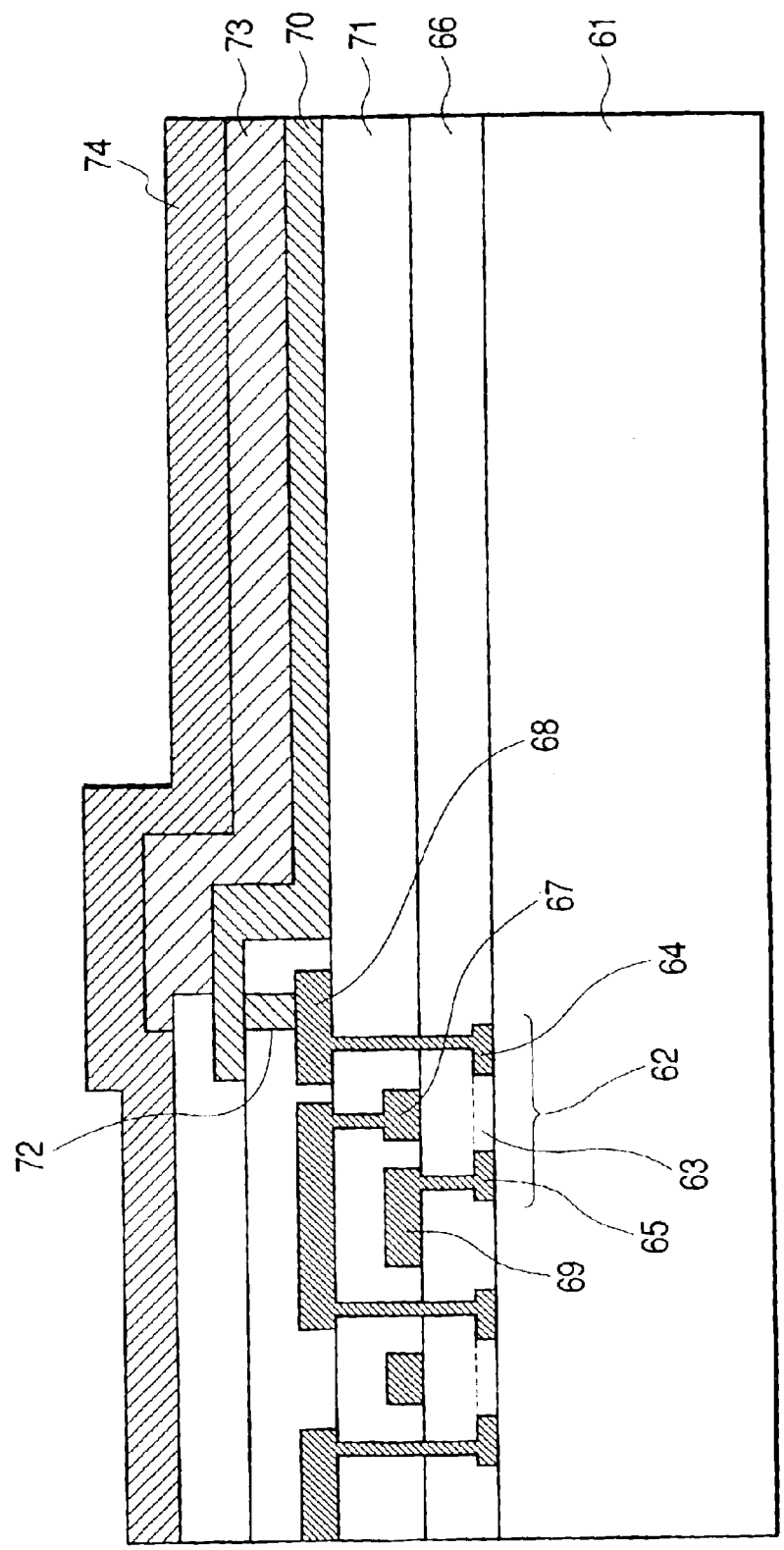
FIG. 6 is a schematic view showing an example of a cross-sectional structure of a TFT substrate.

FIG. 6 is a schematic view of a cross-sectional structure of a TFT used in this example. A polysilicon (p-Si) layer 62 is formed on a glass substrate 61, and a channel region 63, a drain region 64 and a source region 65 are doped with necessary impurities. A gate electrode 67 is formed thereon through a gate insulating layer 66, and a drain electrode 68 and a source electrode 69 connected to the drain region and the source region are formed, respectively. In this case, the drain electrode 68 is connected to a transparent pixel electrode (ITO) 70 through a contact hole 72 made in an insulating layer 71 that intervenes between them.

There is no limitation in the active devices used for the device of the present invention, and a single-crystal silicon TFT, an amorphous silicon (a-Si) TFT and the like can also be used.

A multi-layer or single-layer organic light emitting layer 73 can be formed on the above-described pixel electrode, and a metal electrode 74, which is a cathode, can be stacked sequentially to obtain an active organic light emitting display device.

According to the present invention, as described above, an organic light emitting device having a long device lifetime can be obtained. The organic light emitting device of the present invention is also excellent as a display device.

Furthermore, since the organic light emitting device of the present invention has a high light emitting efficiency, it can be applied to various products that require energy saving or high luminance. Examples of such applications include a light source for display apparatuses, illumination apparatuses, printers and the like; and a backlight for liquid-crystal display apparatuses. When it is applied to display apparatuses, lightweight flat-panel displays with energy saving performance and high visibility can be manufactured. When it is applied to illumination apparatuses or backlights, energy-saving effect can be expected.

What is claimed is:

1. An organic light emitting device comprising a pair of electrodes provided on a substrate, and a light emitting layer comprising at least one layer of an organic substance and provided between the electrodes, wherein the light emitting layer comprises a first organic substance and a second organic substance that mainly concerns a light emission wavelength of the light emitting layer, and wherein the first organic substance comprises a fluorine-containing organic compound and the second organic substance comprises a phosphorescent organic compound.

2. The organic light emitting device according to claim 1, wherein the fluorine-containing organic compound contains a single fluorine atom in a molecule or repeating unit thereof.

3. The organic light emitting device according to claim 1, wherein the content of fluorine in the first organic substance is 1% by weight or more.

4. An organic light emitting device comprising a pair of electrodes provided on a substrate, and a light emitting layer comprising at least one layer of an organic substance and provided between the electrodes, wherein the light emitting layer comprises a first organic substance and a second organic substance that mainly concerns a light emission wavelength of the light emitting layer, and wherein the first organic substance comprises a fluorine-containing organic compound and the content of fluorine in the first organic substance is 1% by weight or more.

5. An organic light emitting device comprising a pair of electrodes provided on a substrate, and a light emitting layer comprising at least one layer of an organic substance and provided between the electrodes, wherein the light emitting layer comprises a first organic substance and a second organic substance that mainly concerns a light emission wavelength of the light emitting layer, and wherein the first organic substance comprises a fluorine-containing organic compound and wherein the second organic substance contains fluorine.

6. The organic light emitting device according to claim 5, wherein each of the first and second organic substance is composed of plural kinds of organic compounds, and all the organic compounds contain at least one fluorine atom in a molecule or repeating unit thereof.

7. The organic light emitting device according to claim 6, wherein all of the organic compounds contain a single fluorine atom in a molecule or repeating unit thereof.

8. The organic light emitting device according to claim 5, wherein the second organic substance contains a phosphorescent organic compound.

9. The organic light emitting device according to claim 6, wherein the second organic substance contains a phosphorescent organic compound.

10. The organic light emitting device according to claim 5, wherein the content of fluorine in each of the first and the second organic substances is 1% by weight or more.

11. The organic light emitting device according to claim 5, wherein the second organic substance contains a phosphorescent organic compound.

12. An organic light emitting device comprising a pair of electrodes provided on a substrate, and a light emitting layer comprising at least one layer of an organic substance and provided between the electrodes, wherein the light emitting layer comprises a first organic substance and a second organic substance that mainly concerns a light emission wavelength of the light emitting layer, and wherein the first organic substance comprises a fluorine-containing organic compound and wherein the second organic substance contains a phosphorescent organic compound, and the phosphorescent organic compound contains a metal element selected from the group consisting of Cu, Re, Rh, Pt, Ru, Tm, Ir, and Au, and fluorine.

13. An organic light emitting device comprising a pair of electrodes provided on a substrate, and a light emitting layer comprising at least one layer of an organic substance and provided between the electrodes, wherein the light emitting layer comprises a first organic substance and a second organic substance that mainly concerns a light emission wavelength of the light emitting layer, and wherein the first organic substance comprises a fluorine-containing organic compound and wherein the second organic substance contains a phosphorescent organic compound and the phosphorescent organic compound contains iridium and fluorine.

14. An organic light emitting device comprising a pair of electrodes provided on a substrate, and a light emitting layer comprising at least one layer of an organic substance and provided between the electrodes, wherein the light emitting layer comprises a first organic substance and a second organic substance that mainly concerns a light emission wavelength of the light emitting layer, and wherein the first organic substance comprises a fluorine-containing organic compound and wherein the first organic substance contains a compound having any one of the structures shown in the general formulas (1) below, and the second organic substance contains a compound having one of the structures shown in the general formulas (2) below General Formulas (I)

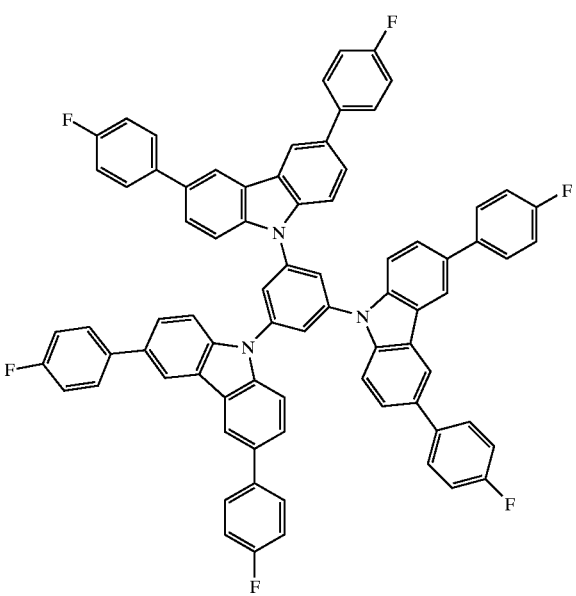

25
-continued
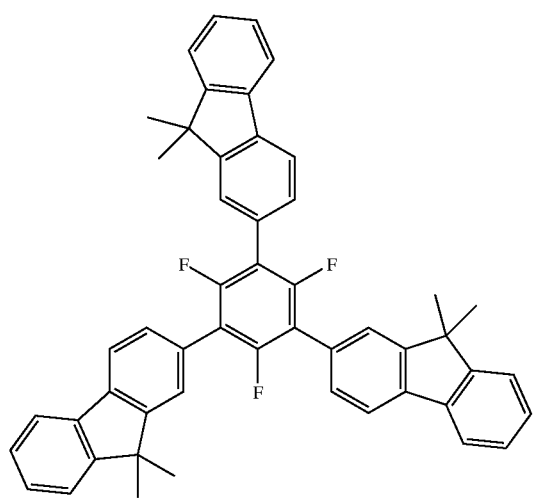
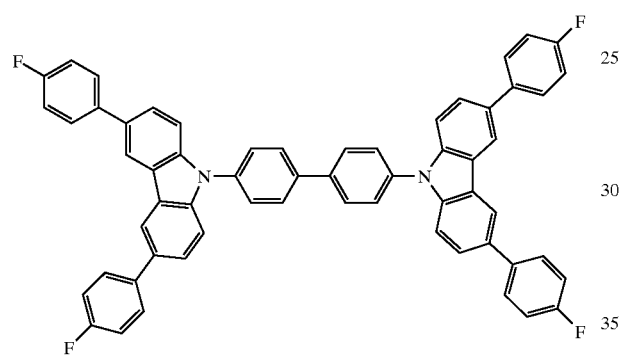
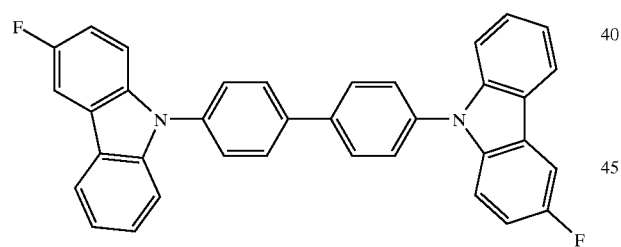
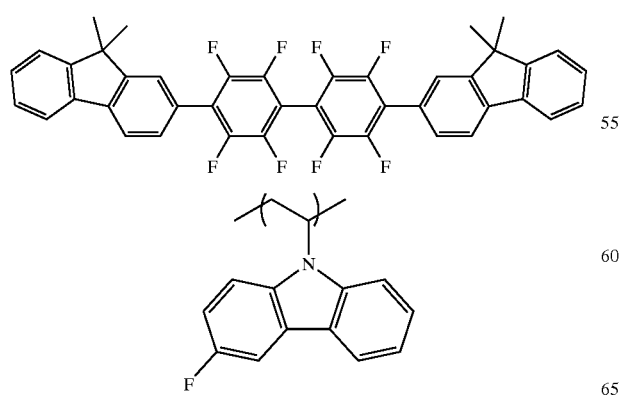
26
-continued
General Formulas (2)
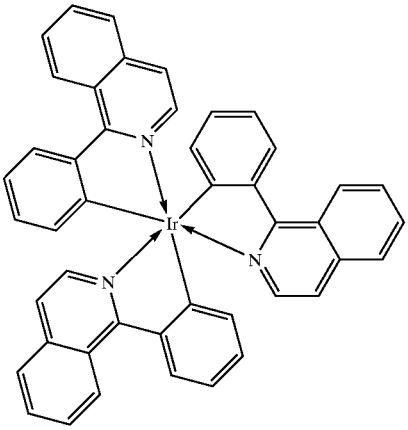
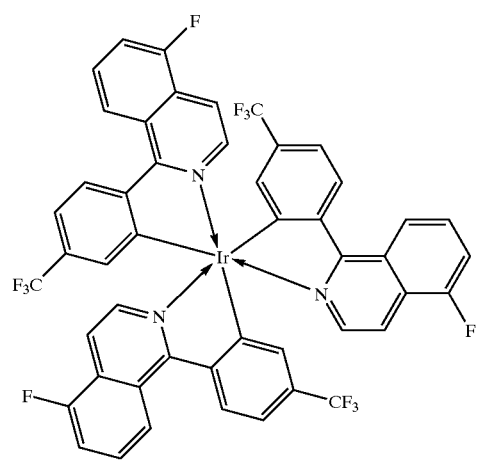
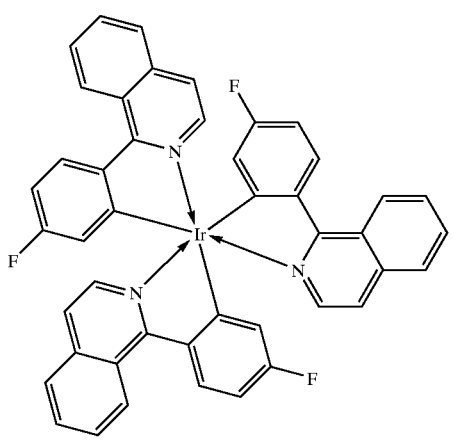

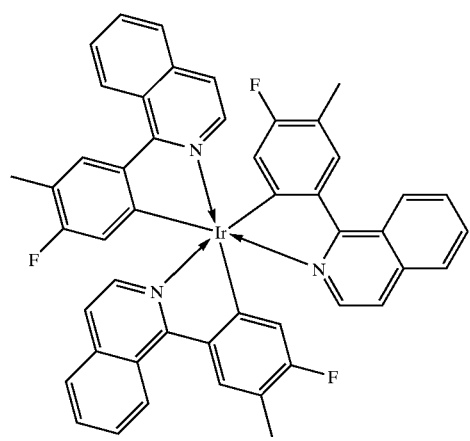
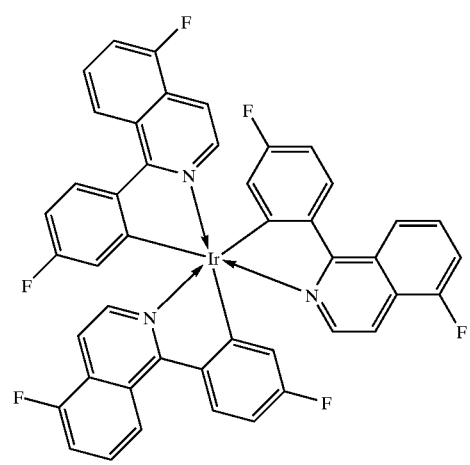
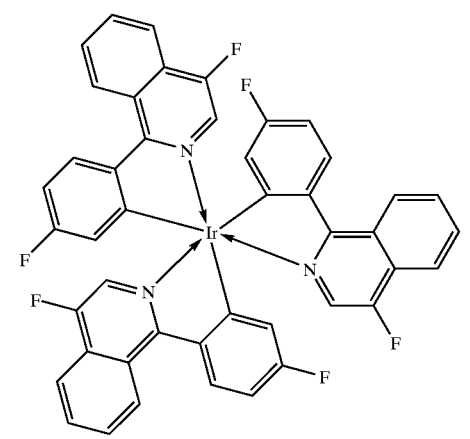
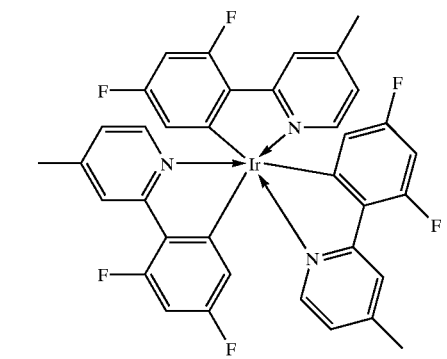
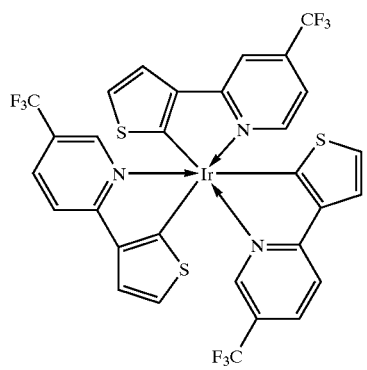
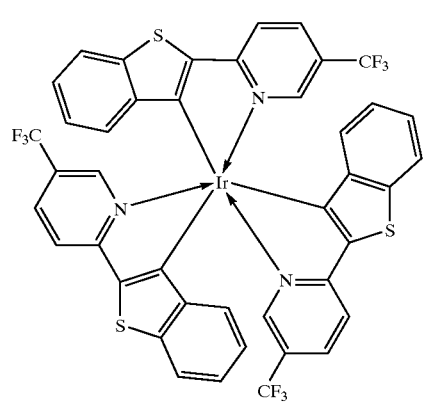
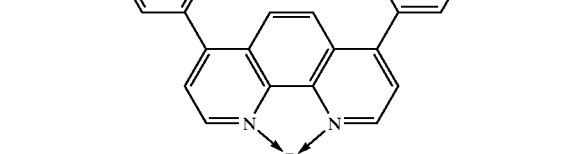
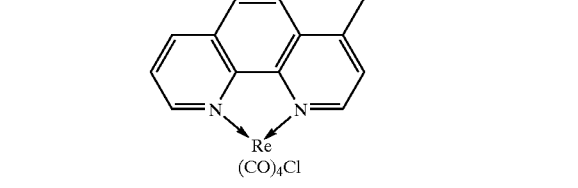
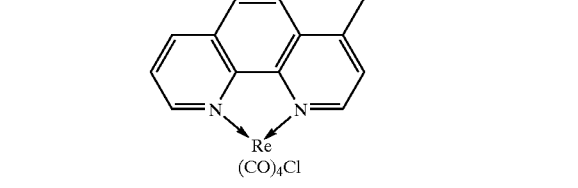

29
-continued

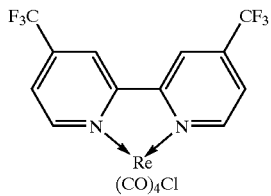

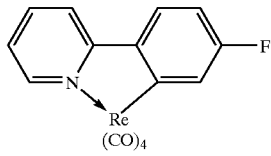

30
-continued

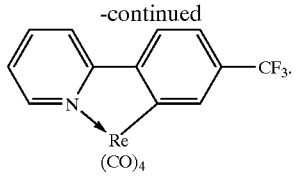

15. An organic light emitting device comprising a pair of electrodes provided on a substrate, and a light emitting layer comprising at least one layer of an organic substance and provided between the electrodes, wherein the light emitting layer comprises a first organic substance and a second organic substance that mainly concerns a light emission wavelength of the light emitting layer, and wherein the first organic substance comprises a fluorine-containing organic compound and further comprising another organic substance layer between the electrodes, and all the organic substance layers contain fluorine.

* * * * *

UNITED STATES PATENT AND TRADEMARK OFFICE
CERTIFICATE OF CORRECTION

PATENT NO. : 6,812,497 B2 Page 1 of 1
DATED : November 2, 2004
INVENTOR(S) : Jun Kamatani et al.

It is certified that error appears in the above-identified patent and that said Letters Patent is hereby corrected as shown below:

Title page,
Item [75], Inventors, "Jun Kamatani, Ohta-Ku (JP); Shinjiro Okada, Ohta-Ku (JP), Akira Tsuboyama, Ohta-Ku (JP); Takao Takiguchi, Ohta-Ku (JP), Seishi Miura, Ohta-Ku (JP); Takashi Moriyama, Ohta-Ku (JP); Satoshi Igawa, Ohta-Ku (JP); Manabu Furugori, Ohta-Ku (JP); Hironobu Iwawaki, Ohta-Ku(JP)" should read -- Jun Kamatani, Kanagawa (JP); Shinjiro Okada, Kanagawa (JP), Akira Tsuboyama, Kanagawa (JP); Takao Takiguchi, Kanagawa (JP), Seishi Miura, Kanagawa (JP); Takashi Moriyama, Kanagawa (JP); Satoshi Igawa, Kanagawa (JP); Manabu Furugori, Kanagawa (JP); Hironobu Iwawaki, Kanagawa (JP) --.

Column 2,
Line 43, "O'brien" should read -- O"Brien --.

Column 5,
Line 33, "vies" should read -- views --.

Column 12,
Line 39, "Al" should read -- Al. --

Column 19,
Line 17, "Al" should read -- Al. --

Signed and Sealed this

Seventeenth Day of May, 2005

JON W. DUDAS
*Director of the United States Patent and Trademark Office*